(12) United States Patent
Xiang et al.

(10) Patent No.: US 6,368,950 B1
(45) Date of Patent: Apr. 9, 2002

(54) SILICIDE GATE TRANSISTORS

(75) Inventors: Qi Xiang, San Jose, CA (US); Paul R. Besser, Austin, TX (US); Matthew S. Buynoski, Palo Alto, CA (US); John C. Foster; Paul L. King, both of Mountain View, CA (US); Eric N. Paton, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/734,186

(22) Filed: Dec. 12, 2000

(51) Int. Cl.[7] .......................................... H01L 21/3205
(52) U.S. Cl. .................. 438/592; 438/655; 438/299; 438/301; 438/305
(58) Field of Search ................................. 438/592–594, 438/655, 649, 682, 660–664, 299–303, 305–306

(56) References Cited

U.S. PATENT DOCUMENTS 5,397,909 A * 3/1995 Moslehi ........................ 257/383
5,960,270 A    9/1999 Misra et al.
6,087,231 A * 7/2000 Xiang et al. ................... 438/287

FOREIGN PATENT DOCUMENTS

JP    10125622    * 5/1998 ........... H01L/21/28

* cited by examiner

Primary Examiner—Charles Bowers
Assistant Examiner—Thanh Nguyen

(57) ABSTRACT

A method for implementing a self-aligned metal silicide gate is achieved by confining amorphous silicon within a recess overlying a channel and annealing to cause the amorphous silicon with its overlying metal to interact to form the self-aligned metal silicide gate. A gate dielectric layer formed of oxynitride or a nitride/oxide stack is formed on the bottom and sidewalls of the recess prior to depositing the silicon. The silicon is removed except for the portion of the silicon in the recess. The remaining portions of the metal are removed by manipulating the etch selectivity between the metal and the self-aligned metal silicide gate.

24 Claims, 5 Drawing Sheets

SILICIDE GATE TRANSISTORS

The ion implantation step is followed by an annealing step which normally involves a high temperature of 700° C. or higher to activate the implanted impurity atoms in the shallow source/drain regions 16 and to cure the damage caused by the physical impact to the crystal structure of the silicon substrate 10 when the impurity atoms are implanted thereto. Sidewall spacers 18 are then formed on the side surfaces of the gate dielectric 12 and gate electrode 14, as depicted in FIG. 3.

Subsequently, source/drain regions 20 are formed by ion implanting impurity atoms, e.g., boron or phosphorus, at the impurity implantation concentration and energy higher than those from the first annealing process, by utilizing the gate electrode 14 and the sidewall spacers 18 as a mask, as depicted in FIG. 4. Once again, the annealing process is performed at a high temperature of 700° C. or higher to activate the implanted impurity atoms in the source/drain regions 20 and to cure the damage caused by the implantation impact.

As transistor dimensions approached one micron in diameter, conventional parameters resulted in intolerably increased resistance between the active region 20 and conductive interconnect lines formed subsequently to interconnect various device elements in the integrated circuit device. The principle way of reducing such contact resistance is by forming a metal silicide atop the source/drain regions 20 and the gate electrodes 14 prior to application of the conductive film for formation of the various conductive interconnect lines. The most common metal silicide materials are $CoSi_2$ and $TiSi_2$.

As depicted in FIG. 5, a metal layer 22 is typically provided by first applying a thin layer of, for example, titanium, atop the wafer which contacts the source/drain regions 20. Then, the wafer is subjected to one or more annealing steps at the temperature of 800° C. or higher. This causes the titanium layer 22 to selectively react with the silicon of the source/drain regions 20 and the gate electrodes 14, thereby forming a metal silicide ($TiSi_2$) layer 24 selectively on the source/drain regions 20 and the gate electrodes 14. Such a process is referred to as a salicide (self-aligned silicide) process because the $TiSi_2$ layer 24 is formed only where the titanium material directly contacts the silicon source/drain regions 20 and the polycrystalline silicon gate electrode 14. Following the formation of the silicide layer 24, as depicted in FIG. 7, an interlayer dielectric film 26 is deposited over the entire surface of the substrate 10, and an interconnect process is performed (not shown) to provide conductive paths by forming via holes through the interlayer dielectric 26 and filling the via holes with a conductive material, e.g., tungsten.

As the dimensions of the MOS transistor are further scaled down to submicron and nanometer dimensions, the thickness of the gate oxide is also scaled down accordingly. However, such excessively reduced thickness of the gate oxide causes charge carrier leakage by tunneling effect, thereby leading to faster degradation of the MOS transistor.

To solve this problem, a high k (dielectric constant) gate dielectric, e.g., $ZrO_2$, $HfO_2$, $InO_2$, $LaO_2$, $TaO_2$, was introduced to replace the silicon oxide for submicron MOS devices. However, it has been also observed that the high k gate dielectric becomes thermally unstable during the high temperature process steps for fabrication of the MOS transistor. For example, as mentioned above, the source/drain region activation annealing steps in FIGS. 2 and 4 and the silicidation step in FIG. 6 are normally performed at a temperature of at least 700° C. or higher, or in some cases at a temperature of 1000° C. or higher. At such a high temperature, tantalum oxide ($Ta_2O_5$), another high k gate dielectric, is transformed from amorphous to crystalline, which causes charge carrier leakage. In addition, at such a high temperature, tantalum oxide undesirably interacts with the underlying silicon substrate or overlying polysilicon gate electrode of the MOS transistor.

To solve this problem, a metal gate electrode has been introduced to avoid the reaction between the high k gate dielectric and the polysilicon gate electrode during the high temperature processing steps. For example, as described in the U.S. Pat. No. 5,960,270 by Misra, et al. a metal deposition process was proposed to form a metal gate layer by depositing molybdenum, tungsten, tungsten silicide, nickel silicide, or titanium nitride. However, it has been also observed that the metal atoms from the gate electrode diffuse into the gate dielectric, thereby causing faster degradation of the high k gate dielectric, and both the high k gate dielectric and the metal gate electrode suffer structural stress from such high temperature process steps. Also, since the metal or metal silicide layer is deposited entirely over the semiconductor structure, it has been observed that it is difficult to controllably remove the unnecessary portions of the deposited metal or metal silicide layer to shape a metal or metal silicide gate due to the material unity.

Thus, there is a continuing need for improved methods that enable implementation of a reliable gate structure in submicron MOS transistors without the undesirable side effects and complicated process steps.

SUMMARY OF THE INVENTION

These and other needs are met by the present invention that provides a method for forming a self-aligned metal silicide gate on a gate dielectric formed of oxynitride or a nitride/oxide stack within semiconductor structures. The method includes forming a precursor having a substrate with active regions separated by a channel, and a temporary gate over the channel and between dielectric structures. The temporary gate is removed to form a recess with a bottom and sidewalls between the dielectric structures. A gate dielectric formed of oxynitride or a nitride/oxide stack is formed in the recess on the bottom and sidewalls. Amorphous silicon is deposited over the semiconductor structure and the amorphous silicon is removed except for a portion in the recess. A metal is formed over the semiconductor structure, and annealing is performed to cause the metal and the portion of the amorphous silicon in the recess to react to form a self-aligned metal silicide gate. Finally, the metal remaining unreacted after the annealing is removed from the semiconductor structure.

Hence, in accordance with an aspect of the present invention, the amorphous silicon deposited over the semiconductor structure is removed except for a portion in the recess, which enables the portion in the recess to selectively interact with the overlying metal, thereby forming the self-aligned metal silicide gate selectively within the recess. Since the silicidation between the silicon and the metal occurs selectively in the recess, and other portions of the metal remain unchanged, the remaining portions of the metal can be easily removed, by manipulating the etching selectivity between the metal silicide and the metal. Also, since the dielectric is formed of oxynitride or a nitride/oxide stack, which is less likely to become unstable during a high temperature silicidation process, the silicidation process needs not to performed below a certain temperature, e.g., 600° C. to ensure the reliability of conventional silicon oxide or high k gate dielectrics, and therefore a wider range of metal materials can be selected to form the metal silicide gate.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF THE EXEMPLARY EMBODIMENTS

The method steps described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-section portions of a semiconductor chip or a substrate during fabrication are not drawn to scale, but instead are drawn to illustrate the feature of the present invention.

The present invention provides a method for implementing a self-aligned metal silicide gate on a gate dielectric formed of oxynitride or a nitride/oxide stack without the problems of conventional silicon oxide or high k gate dielectrics and polysilicon or metal gate electrodes in conventional methods. This is achieved by using dummy gate techniques to confine amorphous silicon within a recess formed over a channel and annealing to cause the amorphous silicon and its overlying metal to react to form a self-aligned metal silicide gate. Since the removal of the amorphous silicon except for the portion in the recess is performed prior to the silicidation process, the remaining unreacted portions of the metal can be easily removed, for example, by planarization, e.g., chemical mechanical polishing. Also, since the dielectric is formed of oxynitride or a nitride/oxide stack, which is less likely to become unstable during a high temperature silicidation process, the silicidation process needs not be performed below a certain temperature, e.g., 600° C. to ensure the reliability of conventional silicon oxide or high k gate dielectrics, and therefore a wider range of metal materials can be selected to form the metal silicide gate.

Figure 1:
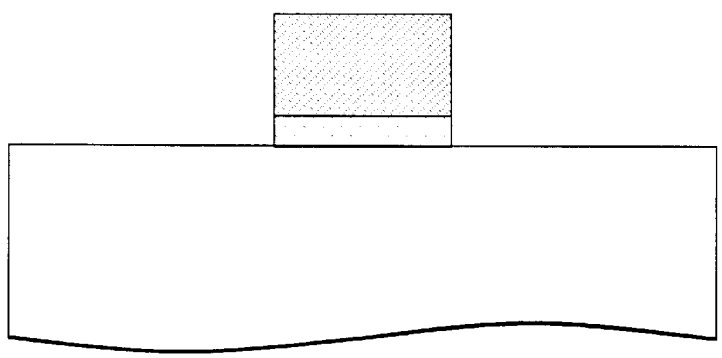
FIG. 1 is a schematic depiction of a cross-section of a prior art semiconductor structure, in which a gate electrode is formed on a semiconductor substrate with a gate oxide therebetween.
Figure 2:
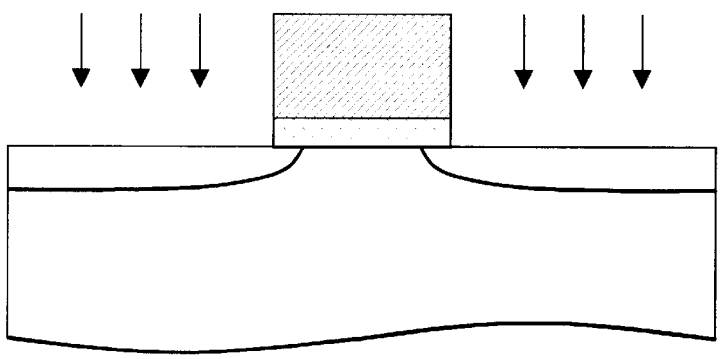
FIG. 2 depicts the portion of FIG. 1, during the first ion implantation process to form shallow source and drain regions on the main surface of the substrate.
Figure 3:
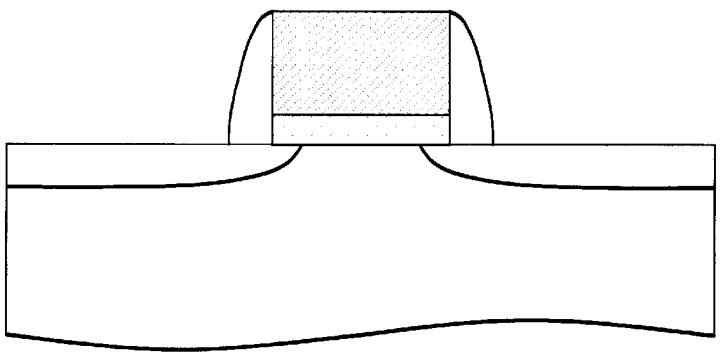
FIG. 3 depicts the portion of FIG. 2, after the first annealing process and a sidewall spacer formation process.
Figure 4:
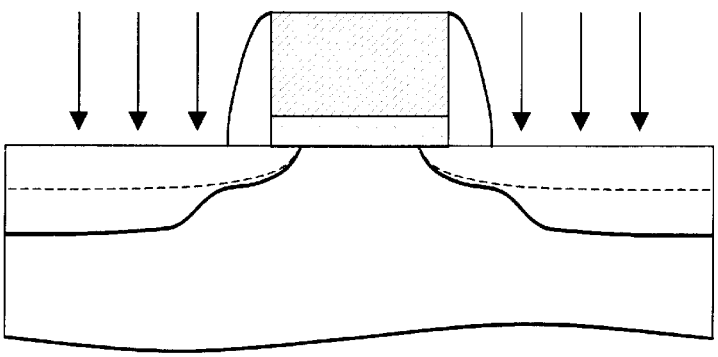
FIG. 4 depicts the portion of FIG. 3, during the second ion implantation process to form source and rain regions on the main surface of the substrate.
Figure 5:
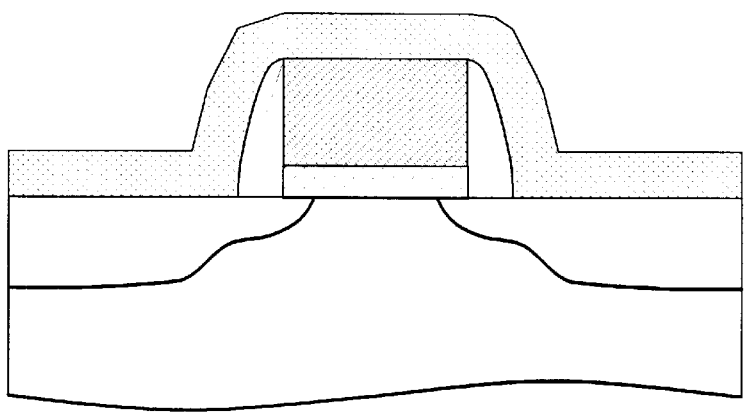
FIG. 5 depicts the portion of FIG. 4, after the second annealing process and a metal layer deposition process.
Figure 6:
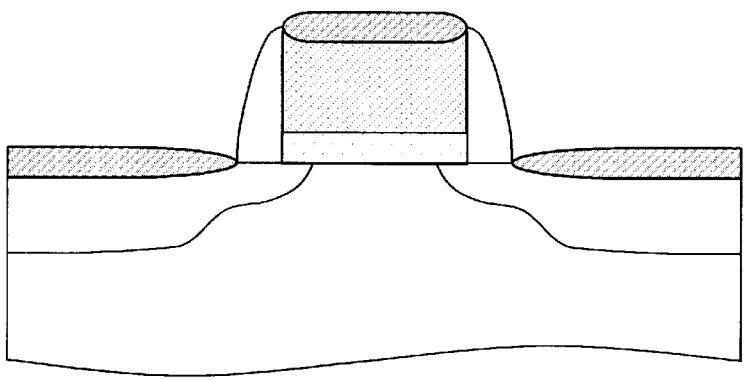
FIG. 6 depicts the portion of FIG. 5, after a silicidation process to form a metal silicide layer on the source and drain regions and the gate electrode.
Figure 7:
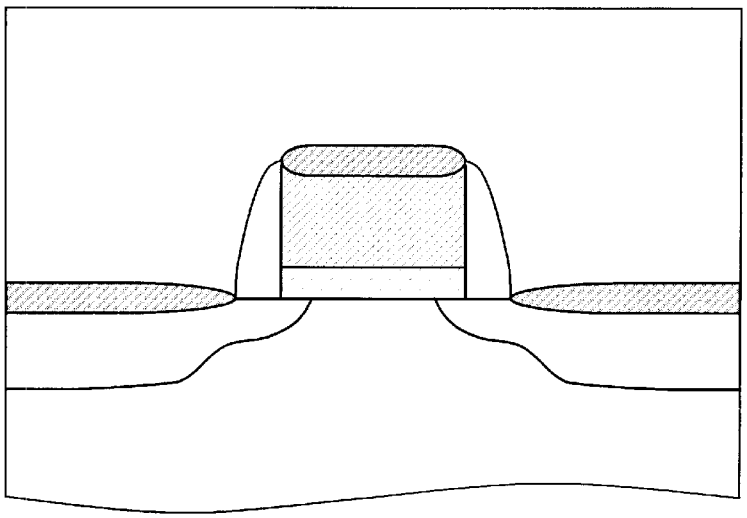
FIG. 7 depicts the portion of FIG. 6, after an interlayer dielectric layer formation.
Figure 8:
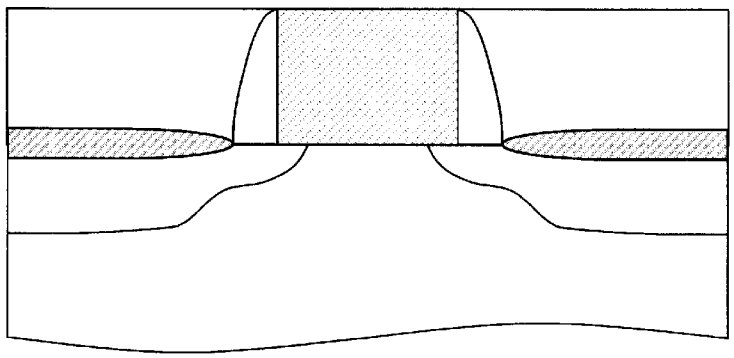
FIG. 8 is a schematic depiction of a cross-section of a semiconductor structure precursor in accordance with embodiments of the present invention.

With this in mind, FIG. 8 is a cross-section of a precursor for the semiconductor structure constructed in accordance with embodiments of the present invention. In FIG. 8, a silicon substrate 10 has active regions 20 formed therein by conventional ion implantation and subsequent annealing techniques. A silicide layer 24 is formed atop the active regions 20 to reduce the resistance between the active regions 20 and conductive interconnect lines which will be formed subsequently.

A polysilicon gate 14, which serves as a temporary gate, is provided on top of the channel. Sidewall spacers 18 are provided on the sidewalls of the gate 14, and interlayer dielectric 26 is provided to cover the active regions 20 and the silicide layer 24. Although it is not shown, if necessary, a silicon oxide gate dielectric could be formed between the substrate 10 and the gate 14.

Figure 9:
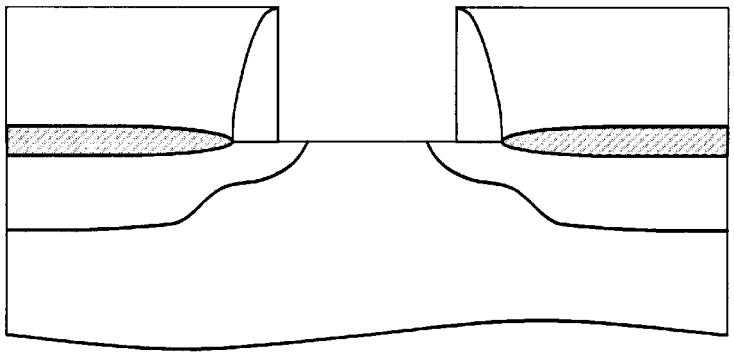
FIG. 9 depicts the portion of FIG. 8, after the temporary gate electrode has been removed to form a recess.

In FIG. 9, the temporary gate 14 is removed from the region between the sidewall spacers 18. A plasma reactive ion etch (RIE) using chlorine or a wet polysilicon etch using conventional etch chemistry may be utilized to remove the polysilicon gate 14 to form an opening (i.e., recess) 28.

Figure 10:
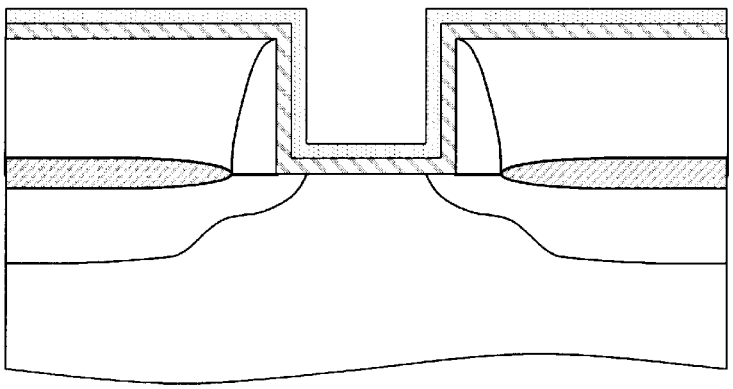
FIG. 10 depicts the portion of FIG. 9, after a gate dielectric formed of oxynitride or a nitride/oxide stack has been deposited on the surfaces of the recess and over the interlayer dielectric layer.

Subsequently, as depicted in FIG. 10, a dielectric layer 31 is formed over the semiconductor structure, particularly on the bottom of the recess 28. The gate dielectric 31 is either a stack of nitride/oxide layers 32, 30, as particularly depicted in FIG. 9, or an oxynitride layer. The gate dielectric layer 31 has the thickness between approximately 10 Å and approximately 25Å, for example.

The oxynitride gate dielectric can be formed by conventional thermal growth or chemical vapor deposition (CVD). For example, oxynitride is thermally grown in a $N_2O$, NO or $NH_3$ ambient at a temperature between approximately 700° C. and approximately 1000° C. for a period between approximately 30 seconds and approximately 90 seconds. In another aspect of the invention, the stack of nitride/oxide layers 32, 30 can be formed by thermally growing oxynitride 30 at the thickness between approximately 5 Å and approximately 8 Å over the semiconductor structure, particularly on the bottom of the recess 28, and subsequently depositing silicon nitride 32 over the oxynitride layer 30 by a chemical vapor deposition (CVD). As previously mentioned, a reason for using oxynitride or a silicon nitride/oxynitride stack is that conventional silicon dioxide is no longer extendable and a high k gate dielectric becomes unstable during the subsequent high temperature process steps.

Figure 11:
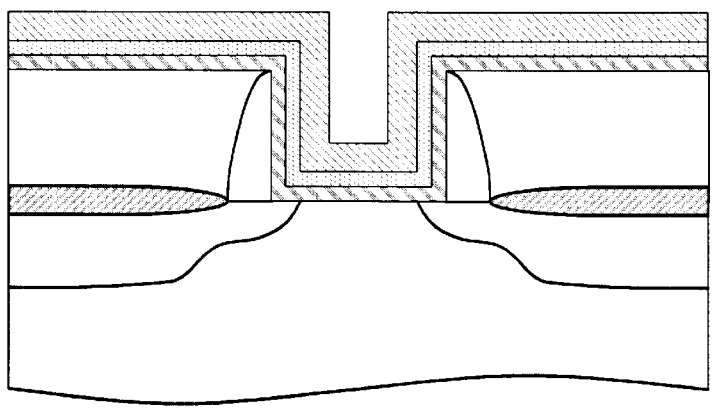
FIG. 11 depicts the portion of FIG. 10, after amorphous silicon has been deposited over the gate dielectric layer.

FIG. 11 depicts the semiconductor structure of FIG. 10, after deposition of an amorphous silicon layer 34. The amorphous silicon layer 32 is provided within the recess 28 on top of the gate dielectric layer 31 by conventional chemical vapor deposition (CVD) at the thickness between approximately 500 Å and approximately 1500 Å. For example, the amorphous silicon layer 32 may be formed by a low pressure chemical vapor deposition (LPCVD) at a temperature between approximately 700° C. and approximately 1000° C.

Figure 12:
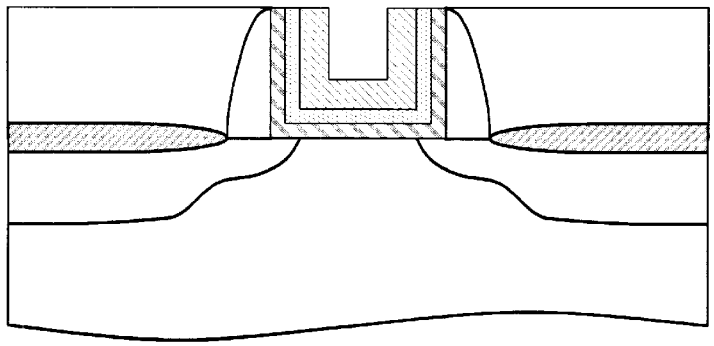
FIG. 12 depicts the portion of FIG. 11, after the amorphous silicon has been removed except for the portion in the recess.

Following the deposition of the amorphous silicon 34, as depicted in FIG. 12, the semiconductor structure of FIG. 11 is planarized, by chemical mechanical planarization (CMP), for example, to remove the amorphous silicon 34 and the gate dielectric 31 except for the portion within the recess 28. As will be described hereafter, by confining the amorphous silicon 32 within the recess 28, a self-aligned silicidation is achieved.

Figure 13:
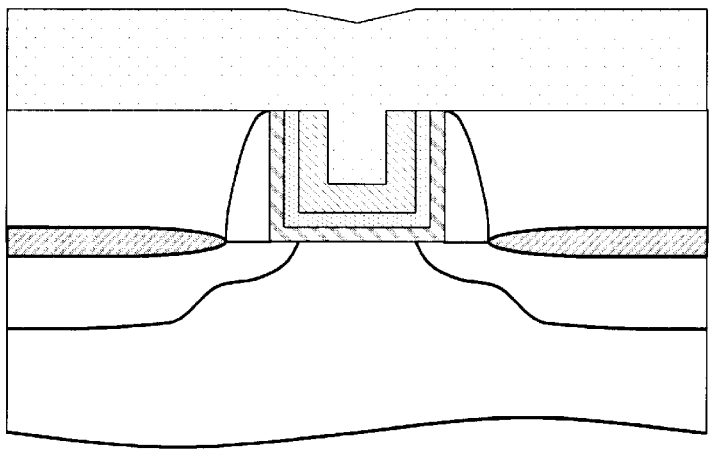
FIG. 13 depicts the portion of FIG. 12, after a metal has been deposited over the entire semiconductor structure.

In FIG. 13, a metal is provided as layer 36 having a thickness between approximately 1000 Å and approximately 2000 Å. Since the gate dielectric 31 endures and does not become unstable during high temperature process steps, a wide range of silicide metal materials can be used, for example, tungsten, titanium, manganese, cobalt, yttrium, platinum or palladium, thereby not limited to low temperature silicidation metals, e.g., nickel.

Figure 14:
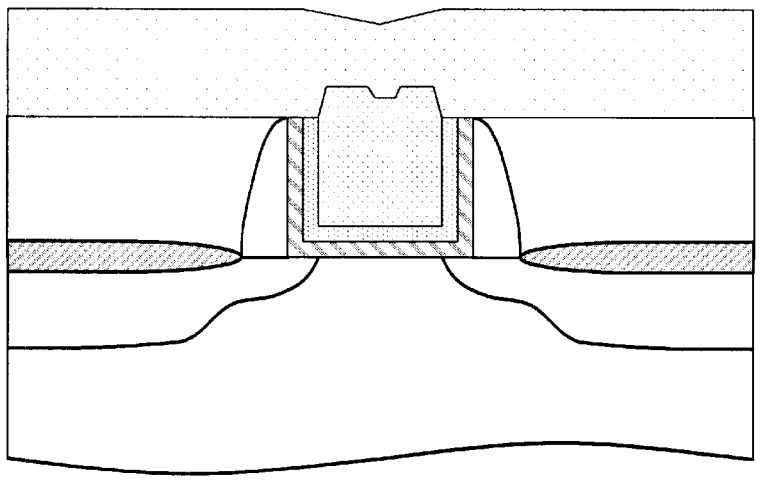
FIG. 14 depicts the portion of FIG. 13, after annealing to form a self-aligned metal silicide gate over the channel.

Subsequently, in FIG. 14, annealing is performed to convert the amorphous silicon 34 confined in the recess 28 to self-aligned silicide 38. Since the metal layer 36 is in limited contact with the amorphous silicon 34 over the recess 28, the self-aligned silicide metal gate 38, e.g., tungsten silicide, titanium silicide, nickel silicide, manganese silicide, cobalt silicide, yttrium silicide, platinum silicide or palladium silicide, is selectively formed over the gate dielectric 31, particularly within the recess 28. Other portions of the metal 36, which are not in contact with the amorphous silicon 34, remain unchanged. The annealing may be performed by conventional rapid thermal annealing at a temperature between approximately 400° C. and approximately 800° C. for a period of between approximately 20 seconds and approximately 60 seconds. As previously mentioned, the gate dielectric layer formed of oxynitride or a nitride/oxynitride stack remains stable at the temperature approximately 600° C. or higher, so that a wide range of silicidation metals can be selected to form metal silicide gate electrodes.

Figure 15:
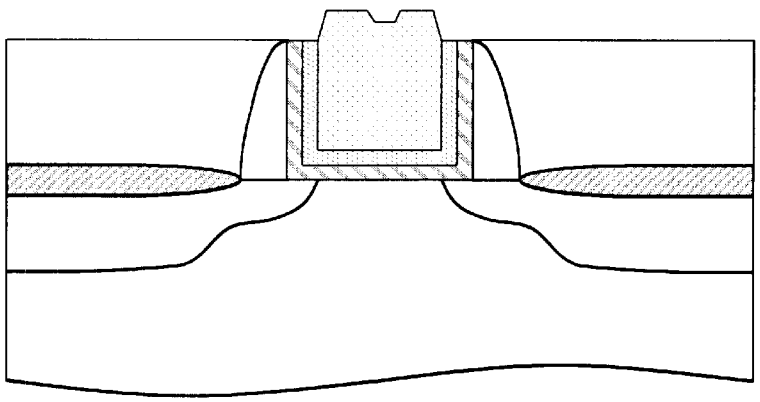
FIG. 15 depicts the portion of FIG. 13, after the metal remaining after silicidation has been removed.

In FIG. 15, the remaining unreacted portion of the metal 36 is removed by conventional etch techniques by utilizing the selectivity between the metal silicide 38 and the metal 36. Since the silicide metal gate 38 is selectively formed over the gate dielectric 31, the remaining silicidation metal 36 can be easily removed by using an etchant having high selectivity between the silicide 38 and the metal 36, for example, sulfuric acid, nitric acid or hydrogen peroxide. The semiconductor structure now has a complete replacement gate electrode comprising the gate dielectric 31 and the metal silicide gate 38.

Thus, the present invention enables implementation of a self-aligned metal silicide gate by manipulating the etch selectivity between a metal silicide gate and a metal overlying the metal silicide gate. Also, since the dielectric is formed of oxynitride or a nitride/oxide stack, which is less likely to become unstable during a high temperature silicidation process, the silicidation process needs not to be performed below a certain temperature, e.g., 600° C. to ensure the reliability of conventional silicon oxide or high k gate dielectrics, and therefore a wider range of metal materials can be selected to form the metal silicide gate.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method for forming a semiconductor structure comprising the steps of:

forming a precursor having a substrate with active regions separated by a channel, and a temporary gate over the channel and between dielectric structures;

removing the temporary gate to form a recess with a bottom and sidewalls between the dielectric structures;

depositing a gate dielectric formed of oxynitride in the recess on the bottom and sidewalls;

depositing amorphous silicon over the semiconductor structure and directly on the oxynitride;

removing the amorphous silicon except for a portion in the recess;

depositing a metal over the semiconductor structure;

annealing to cause the metal and the portion of the amorphous silicon in the recess to react to form a self-aligned metal silicide gate; and removing the metal remaining unreacted after the annealing.

2. The method of claim 1, wherein a thickness of the gate dielectric is between approximately 10 Å and approximately 25 Å.

3. The method of claim 1, wherein the oxynitride gate dielectric is formed by a thermal growth or chemical vapor deposition (CVD).

4. The method of claim 1, wherein the amorphous silicon is formed by a low pressure chemical vapor deposition (LPCVD) at a temperature between approximately 700° C. and approximately 1000° C.

5. The method of claim 1, wherein the amorphous silicon is removed by a chemical mechanical polishing (CMP).

6. The method of claim 5, wherein the gate dielectric is removed by the chemical mechanical polishing except for a portion within the recess.

7. The method of claim 1, wherein the metal is W, Ti, Ni, Mn, Co, Y, Pt or Pd.

8. The method of claim 1, wherein the annealing is performed by a rapid thermal anneal at a temperature between approximately 400° C. and approximately 800°C. for a period between approximately 20 seconds and approximately 60 seconds.

9. The method of claim 1, wherein the remaining metal is removed by an etchant having a high selectivity between the metal and the self-aligned metal silicide gate.

10. The method of claim 9, wherein the etchant is sulfuric acid, nitride acid or hydrogen peroxide.

11. The method of claim 1, the dielectric structures are an interlayer dielectric.

12. A method for forming a semiconductor structure comprising the steps of:

forming a precursor having a substrate with active regions separated by a channel, and a temporary gate over the channel and between dielectric structures;

removing the temporary gate to form a recess with a bottom and sidewalls between the dielectric structures;

depositing a gate dielectric formed of a nitride/oxide stack in the recess on the bottom and sidewalls;

depositing amorphous silicon over the semiconductor structure and directly on the nitride/oxide stack;

removing the amorphous silicon except for a portion in the recess;

depositing a metal over the semiconductor structure;

annealing to cause the metal and the portion of the amorphous silicon in the recess to react to form a self-aligned metal silicide gate; and removing the metal remaining unreacted after the annealing.

13. The method of claim 12, wherein a thickness of the gate dielectric is between approximately 10 Å and approximately 25 Å.

14. The method of claim 12, wherein the nitride/oxide stack gate dielectric is a stack of oxynitride and silicon nitride formed thereon.

15. The method of claim 14, wherein the step of forming the nitride/oxide gate dielectric gate dielectric comprising the steps of:

thermally growing the oxynitride over the semiconductor structure; and depositing the silicon nitride on the oxynitride by a chemical vapor deposition (CVD).

16. The method of claim 15, wherein the thickness of the oxynitride layer is between approximately 5 Å and approximately 15 Å, and the thickness of the silicon nitride layer is between approximately 5 Å and approximately 8 Å.

17. The method of claim 12, wherein the amorphous silicon is formed by a low pressure chemical vapor deposition (LPCVD) at a temperature between approximately 700° C. and approximately 1000° C.

18. The method of claim 12, wherein the amorphous silicon is removed by a chemical mechanical polishing (CMP).

19. The method of claim 18, wherein the gate dielectric is removed by the chemical mechanical polishing except for a portion within the recess.

20. The method of claim 12, wherein the metal is Wi, Ti, Ni, Mn, Co, Y, Pt or Pd.

21. The method of claim 12, wherein the annealing is performed by a rapid thermal anneal at a temperature between approximately 400° C. and approximately 800° C. for a period between approximately 20 seconds and approximately 60 seconds.

22. The method of claim 12, wherein the remaining metal is removed by an etchant having a high selectivity between the metal and the self-aligned metal silicide gate.

23. The method of claim 22, wherein the etchant is sulfuric acid, nitride acid or hydrogen peroxide.

24. The method of claim 12, the dielectric structures are an interlayer dielectric.

* * * * *